United States Patent
Cho et al.

(10) Patent No.: US 9,606,742 B1
(45) Date of Patent: Mar. 28, 2017

(54) VARIABLE PULSE WIDTHS FOR WORD LINE ACTIVATION USING POWER STATE INFORMATION

(71) Applicant: ORACLE INTERNATIONAL CORPORATION, Redwood Shores, CA (US)

(72) Inventors: Hoyeol Cho, Redwood City, CA (US); Jinho Kwack, San Ramon, CA (US); Jilong Shan, San Jose, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/967,748

(22) Filed: Dec. 14, 2015

(51) Int. Cl.
G06F 1/32 (2006.01)
G06F 3/06 (2006.01)
G06F 1/14 (2006.01)

(52) U.S. Cl.
CPC .............. *G06F 3/0625* (2013.01); *G06F 1/14* (2013.01); *G06F 3/0659* (2013.01); *G06F 3/0673* (2013.01)

(58) Field of Classification Search
CPC ......... G06F 1/14; G06F 3/0625; G06F 3/0659
USPC ....................................................... 713/320
See application file for complete search history.

(56) References Cited

U.S. PATENT DOCUMENTS

| | | |
|---|---|---|
| 6,229,746 B1 | 5/2001 | Tooher |
| 6,512,718 B2 | 1/2003 | Lee |
| 6,859,385 B2 | 2/2005 | Karlsson et al. |
| 7,061,792 B1 | 6/2006 | Poplevine et al. |
| 7,312,637 B2 | 12/2007 | Washburn et al. |
| 8,305,832 B2 | 11/2012 | Chen et al. |
| 8,477,527 B2 | 7/2013 | Wang et al. |

(Continued)

FOREIGN PATENT DOCUMENTS

CN 103971733 8/2014

OTHER PUBLICATIONS

Rao et al., "Low Power Design of a SRAM Cell for Embedded Memory", International Journal of Research in Computer and Communication Technology; vol. 2, Issue 11, Nov. 2013; pp. 1222-1228; downloaded from: www.jrcct.org/index.php/ojs/article/view/452/pdf.

(Continued)

*Primary Examiner* — Vincent Tran
(74) *Attorney, Agent, or Firm* — Kraguljac Law Group, LLC

(57) ABSTRACT

Systems, methods, and other embodiments associated with conserving power using variable width pulses to activate word lines are described. In one embodiment, a memory device embedded within a processor. The memory device includes a pulse shaper to generate a first timing delay and a second timing delay according to power state information. The power state information indicates a current operating state of the processor. The memory device includes a memory controller to generate, in response to receiving a request to access one or more memory cells of the memory device, a word line enable signal that activates the one or more memory cells according to the first timing delay, the second timing delay, and a clock signal by generating the word line enable signal with a pulse width that is variable to conserve power when the state information indicates the processor is in a power saving state.

20 Claims, 8 Drawing Sheets

(56) References Cited

U.S. PATENT DOCUMENTS

| | | | | |
|---|---|---|---|---|
| 2005/0083752 A1* | 4/2005 | Lee | ................ | G11C 11/406 365/222 |
| 2009/0158101 A1* | 6/2009 | Abu-Rahma | ............ | G11C 8/08 714/701 |
| 2012/0134226 A1* | 5/2012 | Chow | ................ | G11C 7/08 365/207 |
| 2016/0111144 A1* | 4/2016 | Lien | ................ | G11C 11/419 365/154 |

OTHER PUBLICATIONS

Deng et al., "MemScale: Active Low-Power Modes for Main Memory", pp. 1-14; downloaded from: http://www.research.rutgers.edu/~luramos/pdf/asplos11memscale.pdf.

Nii et al., "A 45-nm Single-Port and Dual-Port SRAM Family with Robust Read/Write Stabilizing Circuitry Under DVFS Environment", pp. 1-2; downloaded on Jul. 7, 2015 from: http://ieexplore.ieee.org/xpl/login.jsp?tp=arnumber=4586011.

Yamaoka et al., "A Cell-Activation-Time Controlled SRAM for Low-Voltage Operation in DVFS SoCs Using Dynamic Stability Analysis", pp. 1-2; downloaded on Jul. 7, 2015 from: http://ieeexplore.ieee.org/xpl/login.jsp?tp=&arnumber=4681848.

Surecore; "Surecore—Technology Whitepaper", May 2013; pp. 1-6; downloaded from: http://www.sure-core.com/downloads/sureCore-Technology-Whitepaper-May13.pdf.

* cited by examiner

VARIABLE PULSE WIDTHS FOR WORD LINE ACTIVATION USING POWER STATE INFORMATION

BACKGROUND

Power consumption in a computing device can influence many aspects of performance. For example, higher operating speeds (i.e., clock frequencies) use more power and also generate more heat. Accordingly, when operating using a battery as a power source tradeoffs between processing performance and power usage are often necessary. In one example, power may be conserved in a memory by reducing power consumed by control signals. However, because of various timing requirements associated with the control signals, an amount of power saved by modifying the control signals may be marginal.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Systems, devices and methods are described herein associated with controlling power consumption in a memory by generating pulses with variable widths depending on a current state of an associated processor. For example, when a processor is in a power saving state, an internal voltage of the processor may be reduced (i.e., lowered from 5V to 2V) and/or an operating frequency of the processor may be reduced in order to conserve power.

Similarly, the memory, which in one embodiment is integrated with the processor, may also conserve power during the power saving state. For example, the memory may conserve power by reducing widths of pulses provided on word lines. A pulse provided on a word line is a control signal that activates/enables a corresponding row of memory cells. Reducing the width of the pulse activates the word line for a shorter duration of time, thereby, conserving power.

However, when timing margins of the memory are frequency independent, an amount by which the pulse width can be reduced may be limited. This is because, for example, the width of the pulse may include a duration of time that accounts for at least one of the frequency independent margins.

Thus, reducing the width of the pulse may reduce the frequency independent margin as well. However, the frequency independent margin is, for example, designed into the memory to ensure proper timing between activation of different components and/or different events in the memory. As a result, reducing the pulse width by too much may infringe on the static duration of time provided for the frequency independent margin causing errors when accessing the memory. Thus, an amount by which the pulse width may be reduced to conserve power is limited when timing margins are frequency independent.

Therefore, in one embodiment, the memory device is configured with frequency dependent margins that vary according to an operating frequency of the memory and/or the processor, and thereby permit greater variation in the pulse width to conserve power. Thus, the memory device generates a pulse with a variable width according to a current operating state of the processor when activating the word line. Consequently, when the memory controls memory access using frequency dependent margins instead of frequency independent margins, the width of the pulse may be reduced by a greater degree to improve conserving power.

Figure 1:
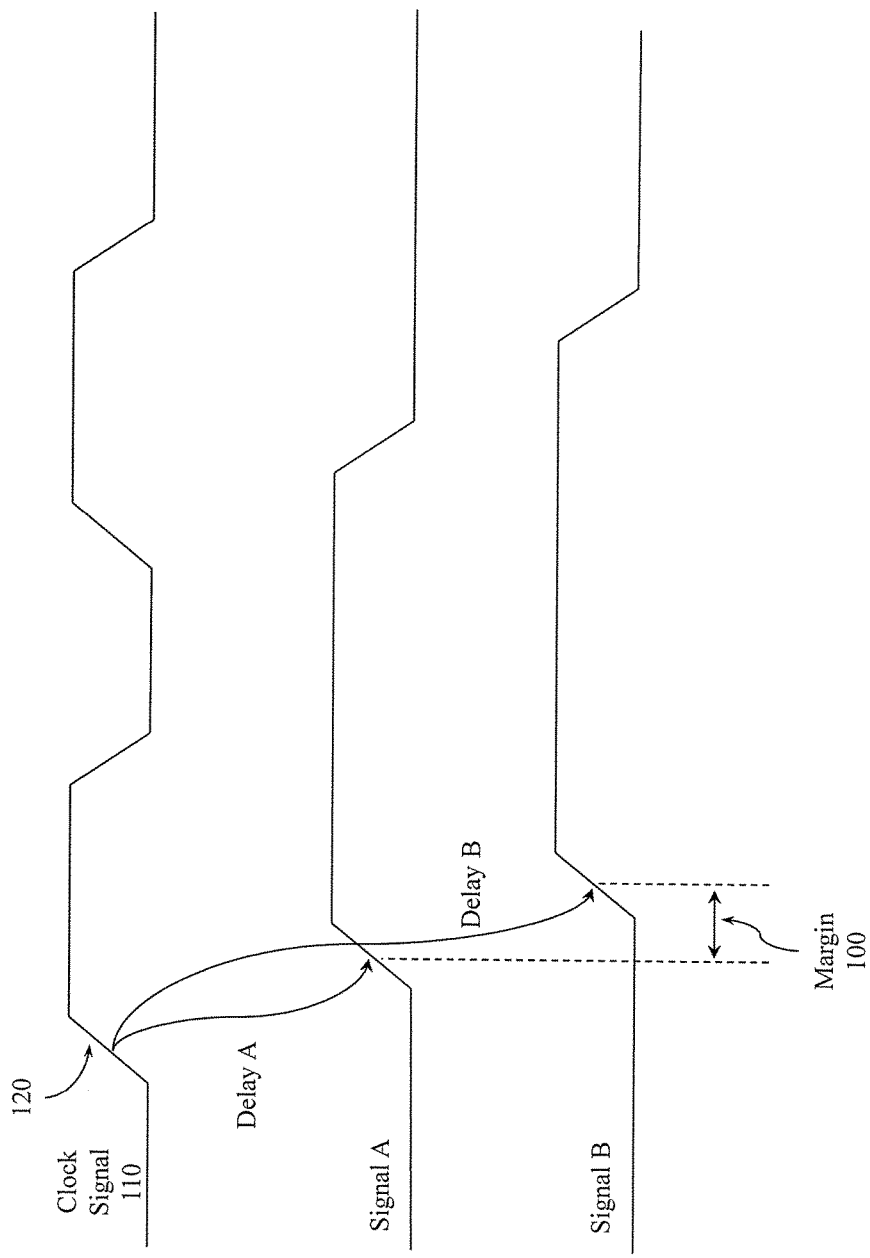
FIG. 1 illustrates one embodiment of a timing diagram of an integrated circuit associated with frequency independent margins.

To better understand the difference between frequency independent margins and frequency dependent margins and how the memory device conserves power when implementing frequency dependent margins, first consider FIG. 1. FIG. 1 illustrates an example of a frequency independent margin 100. In general, a timing margin, such as the frequency independent margin 100, is a duration of time between edges of different signals or between enabling/disabling a single signal. Thus, the timing margin is a duration of time that ensures different events within a circuit occur before, for example, another event occurs.

In FIG. 1, a clock signal 110 triggers signal A and signal B from a rising edge 120. That is, circuitry (not shown) connected to a line that provides the clock signal 110 is connected with additional points in the circuitry such that the rising edge 120 triggers generation of signals A and B after the specified delays A and B, respectively. The margin 100 is illustrated for purposes of example, but, is representative of, for example, a time to develop a bit value on a bit line before enabling a sense amplifier to detect the bit value. Accordingly, if the margin 100 does not permit enough time for the bit value to fully develop on the bit line (e.g., as controlled by signal A), then the sense amplifier may not provide a correct bit value when activated (e.g., as controlled by signal B). In this way, the margin 100 ensures proper timing within the circuitry.

Furthermore, because the signal A and signal B are triggered from a same edge (i.e., rising edge 120) of the clock signal 110, the signals A and B are dependent on the occurrence of the rising edge 120 and not the frequency of the clock signal 120. Accordingly, the margin 100 between the signals A and B is frequency independent since the signals A and B race from the same edge 120 and are otherwise dependent on delays associated with propagating through the circuitry.

Thus, delays A and B are, for example, propagation delays that are generally known and/or designed into the circuit. That is, the circuitry that connects the clock signal 110 to points in the circuitry where signals A and B are generated have associated intrinsic delays. However, the intrinsic delays may vary within a range according to variations attributable to the manufacturing process, current operating voltages, and temperatures of the circuitry. These variations are known as process, voltage, temperature (PVT) variations and are generally accommodated by ensuring the frequency independent margins are at least a certain minimum duration.

For example, because the margin 100 is a frequency independent margin, delay B includes an additional 30% delay to derive a duration for the margin 100 that can ensure avoiding difficulties when conditions affecting the PVT variations occur. In one embodiment, delay B may be equal to delay A plus an additional 30% of delay A (e.g., delay B=delay A*1.30). Thus, altering pulse widths that influence relate to frequency independent margins is generally limited because of built-in time durations that account for PVT variations.

Figure 2:
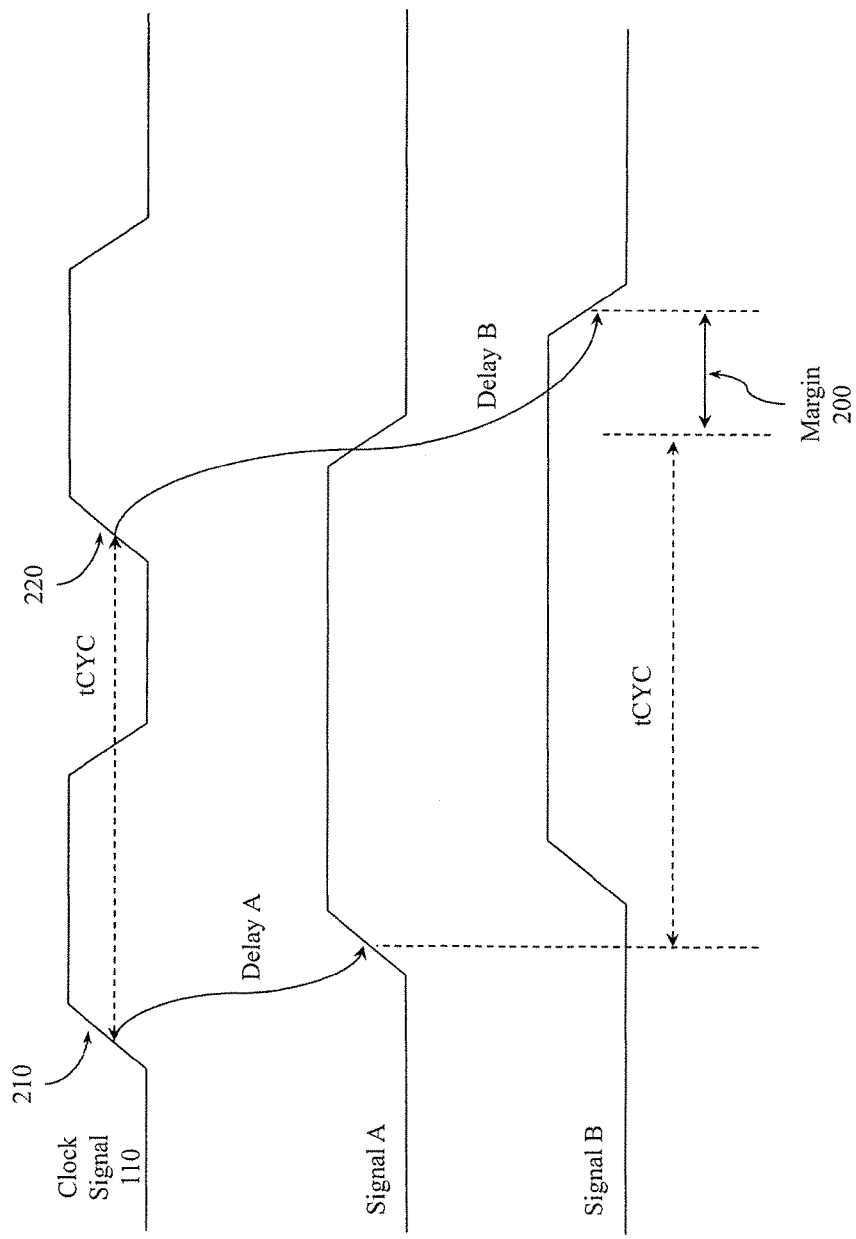
FIG. 2 illustrates one embodiment of a timing diagram of an integrated circuit associated with frequency dependent margins.

By contrast, consider FIG. 2, illustrates a frequency dependent margin 200. The frequency dependent margin 200 does not depend on signals A and B being triggered by a same edge and racing/propagating from the same edge of the clock signal 110 as with the frequency independent margin 100 of FIG. 1. Instead, critical timing aspects of the signals A and B are triggered from separate edges 210 and 220 of the clock signal 110. Thus, the margin 200 need not account for PVT variations since the margin 200 has a built-in duration that is relative to the frequency (tCYC) of the clock signal 110.

Accordingly, by controlling the signals A and B according to separate edges of the clock signal 110, instead of a same edge, the margin 200 becomes frequency dependent and, thus, is no longer dependent on static margins that include PVT variations. In one embodiment, the signals A and B are controlled from separate edges of the clock signal 100 according to, for example, delays A and B that are predefined for the frequency (tCYC). Delays A and B are generally defined such that delay B is greater than delay A (i.e., delay B>delay A). Thus, the frequency dependent margin 200 does not rely on built-in static timing margins for PVT variations. Additionally, the frequency dependent margin may vary along with the frequency (tCYC) of the clock signal (CLK) and thus permits a greater reduction in pulse widths of the word line enable signal (WL) during power saving states. In this way, widths of pulses on the word line (WL) can be varied according to power state information of the processor to conserve power without being constrained by margins that account for PVT variations.

Additionally, while the timing margins 100 and 200 of FIG. 1 and FIG. 2 are illustrated as occurring between two separate signals (i.e., signals A and B), of course, timing margins may involve enabling/disabling a single signal or may occur according to more than 2 signals.

Figure 3:
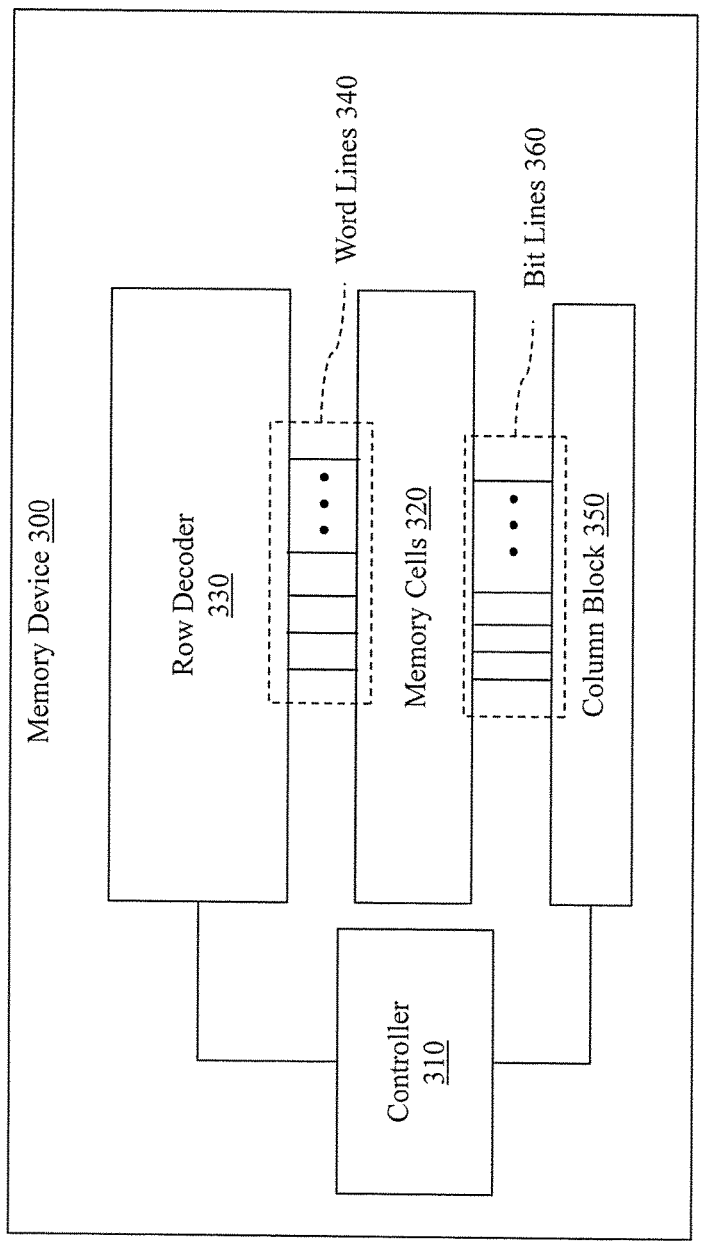
FIG. 3 illustrates one embodiment of a memory device.

To further illustrate the disparity between frequency independent margins and frequency dependent margins and timing sensitivities in a memory, briefly consider memory device 300 of FIG. 3. The memory device 300 includes a controller 310 that controls access to the memory cells 320 for requests provided by, for example, a hardware microprocessor (not shown). When servicing a memory request to either read or write information, the controller 310 provides a row address to a row decoder 330. Subsequently, the row decoder 330 activates one of the word lines 340 connected with the memory cells 320. In one embodiment, each of the word lines 340 are connected with a row of the memory cells 320. Accordingly, activating one of the word lines 340 with a pulse activates a row of the memory cells 320.

While the row decoder 330 is decoding the row address and activating one of word lines 340, the controller 310 issues other control signals to a column block 350. In one embodiment, the controller 310 provides a sense amp enable signal, a column address, and additional signals (e.g., a bit line recover signal) to the column block 350. The column block 350 is connected with the memory cells 320 via bit lines 360. In general, the column block 350 decodes the signals from the controller 310 and activates appropriate components (e.g., sense amplifier, bit line, etc.) to access requested memory cells.

Timing between, for example, when a word line is enabled/disabled, when a word line is enabled and a sense amplifier is enabled, and other timing events in a the memory device 300 are sensitive to variations and generally occur in a certain order and with certain durations within the order so that components in the memory are activated/deactivated correctly. These sensitive timing events are the timing margins discussed previously, and if the order of the signals does not occur according to the timing margins, then resulting memory accesses can fail, provide erroneous data, waste power, and/or result in other difficulties.

Figure 4:
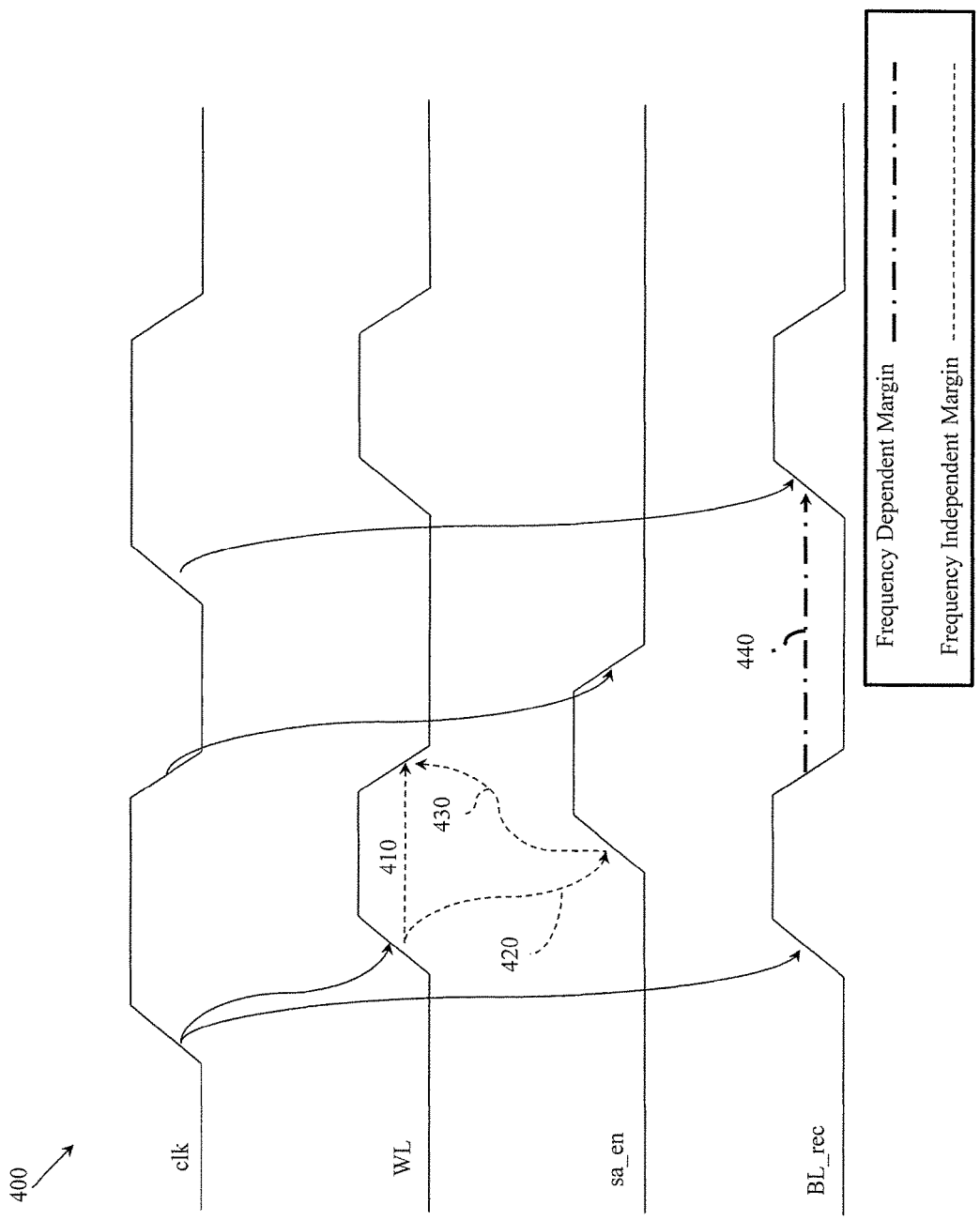
FIG. 4 illustrates one example of a timing diagram associated with the memory device of FIG. 3.

FIG. 4 illustrates one example of a timing diagram 400 for the memory device 300 when implemented with frequency independent timing margins. The timing diagram 400 shows four separate timing margins 410, 420, 430, and 440. The timing margins 410, 420, and 430 are frequency independent timing margins, while margin 440 is frequency dependent. As seen in FIG. 4, the timing margin 440 results from a BL_rec signal being triggered by separate edges of the clk signal. Thus, timing margin 440 is frequency dependent because the triggering events are separate edges of the clock signal (CLK) and, thus, not a single trigger from which two separate signals race.

However, timing margin 410, which corresponds to a width of a pulse on the word line (WL), is frequency independent since the margin 410 is a function of built-in timing and not the clock signal (CLK). Thus, reducing the width of the pulse on the word line for the memory device 300 is constrained because of the frequency independent margin 410 and a duration built into the margin 410 to account for PVT variations. Similarly, for the memory device 300, the timing margins 420 and 430 are also frequency independent and thus further complicate efforts to reduce pulse widths on the word line.

Figure 5:
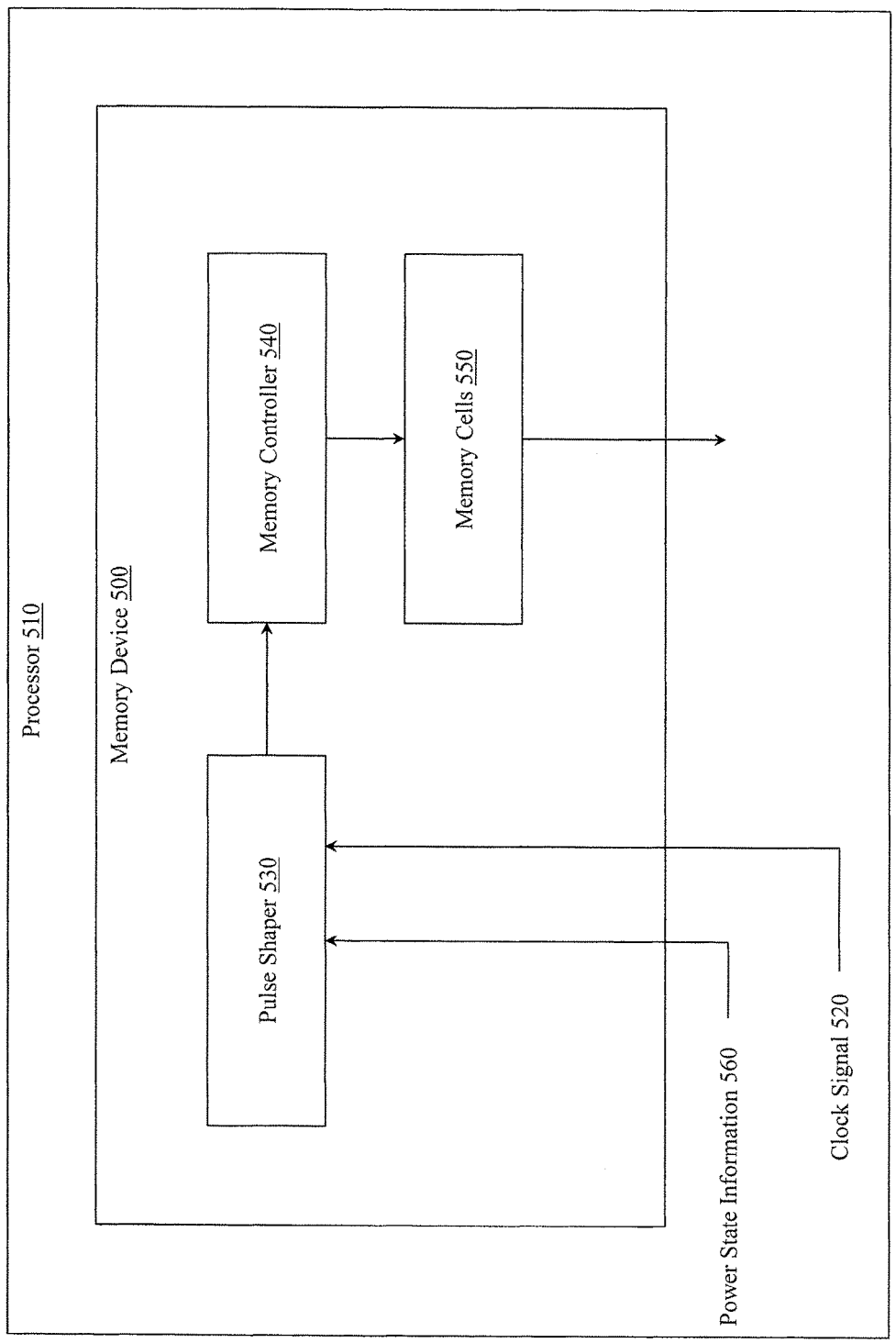
FIG. 5 illustrates one embodiment of a memory device associated with conserving power by varying pulse widths according to power state information.

Accordingly, with reference to FIG. 5, a memory device 500 is illustrated that conserves power by activating word lines using pulses with variable widths according to power state information. In one embodiment, the memory device 500 is an embedded memory of a processor 510 and, thus, may conserve power when the processor 510 is in a low or reduced power state (e.g., standby mode). In either case, the memory device 500 is, for example, a 6-transistor static random access memory (6T SRAM) or similar memory that stores electronic data.

The memory device 500 includes a similar configuration of control lines as the memory device 300. That is, the memory device 500 operates according to a clock signal 520, word lines, sense amplifier lines, bit lines, bit recover line, and so on. Portions of the memory device 500 have been omitted in FIG. 5 for purposes of clarity. For example, the memory device 500 includes a row decoder, memory cells, a column block, word lines, and bit lines in a similar configuration as shown with the memory device 300 of FIG. 3. Additionally, the memory device 500 includes a pulse shaper 530, a memory controller 540 (similar to memory controller 310 of FIG. 3), and memory cells 550 (similar to memory cells 320 of FIG. 3). While the pulse shaper is discussed as a separate element, in one embodiment, the pulse shaper 530 is a subcomponent of the memory controller 540.

The pulse shaper 530 is connected with the processor 510 to obtain the clock signal 520 and power state information 560 from the processor 510. The clock signal 520 is, for example, a control signal provided by the processor 510 that oscillates between a high and low state at a particular frequency. In one embodiment, the frequency of the clock signal 520 is an operating frequency of the processor 510. Accordingly, the memory device 500 may be controlled to operate at a same frequency as the processor 500.

In one embodiment, the power state information 560 is provided to the pulse shaper 530 via a connection to the power management unit. Alternatively, the pulse shaper 530 may retrieve/request the power state information 560 upon receiving a memory request. In either case, the power state information 560 is, for example, information provided by a power management unit (PMU) of the processor 510 that indicates a current operating state of the processor 510. That is, the power state information 560 is, for example, dynamic voltage-frequency scaling (DVFS) information that includes a current operating voltage of the processor 510 and/or may also include a current operating frequency. Of course, while the operating frequency and the voltage are discussed, in other embodiments, the pulse shaper 530 may obtain different information (e.g., operating temperature) from the power management unit as the power state information 560.

Figure 6:
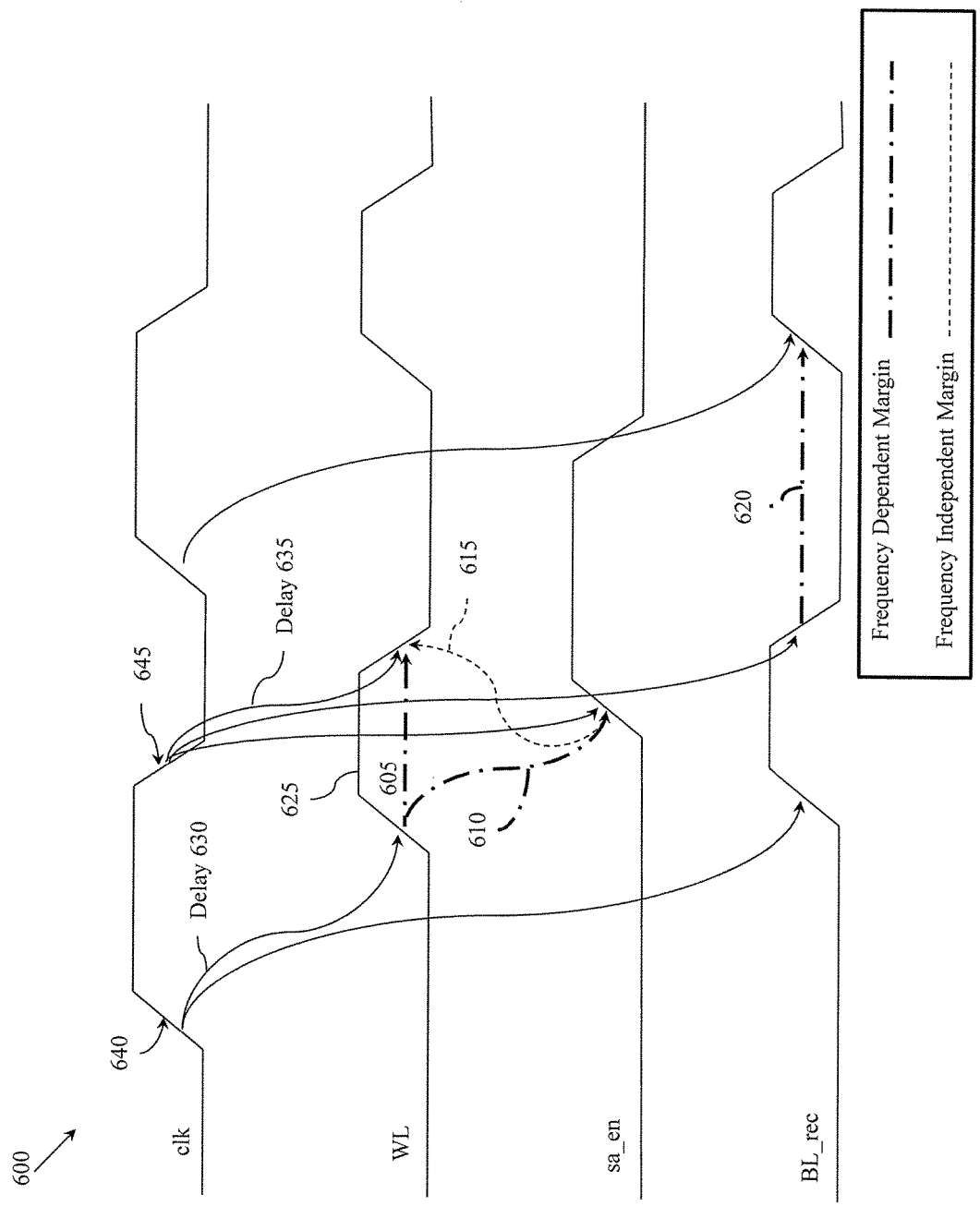
FIG. 6 illustrates one example of a timing diagram associated with the memory device of FIG. 5.

In either case, the memory device 500 uses the power state information 560 to control a width of a pulse used to enable a particular word line when accessing a memory cell. For purposes of clarity in explaining operation of the memory device 500, reference will be made simultaneously to timing diagram 600 of FIG. 6. The timing diagram 600 of FIG. 6 is similar to the timing diagram 400 of FIG. 4 in regards to the signals illustrated (clk, WL, sa_en, BL_rec). Additionally, the timing margins 605, 610, 615, and 620 are similar to the margins 410, 420, 430 and 440, respectively. However, the memory controller 540 is configured to generate the margins 605 and 610 as frequency dependent margins, whereas the margins 410 and 420 are frequency independent margins.

Accordingly, in one embodiment, to provide the margins 605 and 610 as frequency independent margins so that a width of the pulse 625 may be varied according to the power state information, the pulse shaper 530 generates delays 630 and 635 to control the width. For example, the pulse shaper 530 obtains the power state information 560 and according to the power state information 560 generates the delays 630 and 635 to control the width of the pulse 625.

In general, the pulse shaper 530 generates the delays 630 and 635 according to the power state information 560. That is, the pulse shaper 530 generates the delays 630 and 635 to control the width of the pulse 625 so that when the processor 510 is in a power saving mode the width is reduced while also ensuring a duration of the margins 605 and 610 are sufficiently maintained to avoid causing timing errors. Since the margins 605 and 610 have a direct relationship with the width of the pulse 625, as controlled by the delays 630 and 635, the pulse shaper 530 can manipulate the delays 630 and 635 to vary the width of the pulse 625 and the margins 605 and 610.

In one embodiment, the pulse shaper 530 selects the delays 630 and 635 from a set of delays that are predetermined and configured within the pulse shaper 530. Since the delays 630 and 635 depend on a frequency of the clock signal (CLK), the delays 630 and 635 can be predetermined and configured into the pulse shaper 530. Thus, depending on an operating frequency and/or voltage of the processor 510, the pulse shaper 530 selects the delays 630 and 635, such that the width of the pulse 625 is generated to conserve power in comparison to when the processor 510 is operating in a normal power mode.

Furthermore, the memory controller 540 uses the delays 630 and 635 when accessing the memory cells 550 to account for the timing margins 605 and 610 while reducing the width of the pulse 625 to conserve power. In this way, the memory controller 540 generates the pulse 625 while controlling the timing margins 605 and 610 to be frequency dependent.

That is, to accommodate reducing a width of the pulse 625 to conserve power, the memory controller 540 generates the pulse 625 to enable the word line (WL) such that a leading edge of the pulse 625 occurs after the selected delay 630 from a leading edge 640 of the clock signal (clk). Thus, the leading edge 640 of the clock signal (clk) triggers the pulse 625 with the delay 630 as generated by the pulse shaper 530.

Furthermore, the memory controller 540 controls the timing margin 605 to be frequency dependent by disabling the pulse 625 on the word line (WL) according to the tailing edge 645 of the clock signal (clk) and the selected delay 635. By activating/deactivating the pulse 625 according to different edges of the clock signal (clk), the timing margin 605 becomes dependent on a frequency of the clock signal (clk) and is thus a frequency dependent margin. Accordingly, the memory controller 540 can manipulate the width of the pulse 625 according to the delays 630 and 635 to conserve power without interfering with the margins 605 and/or 610.

Additionally, because the leading edge of the pulse 625 and the leading edge of the sense amp enable signal (sa_en) are activated according to different edges of the clock signal (clk), the margin 610 is also frequency dependent. Thus, the width of the pulse can be modified (i.e., reduced) by a greater degree since the timing margins 605 and 610 are frequency dependent and more flexible than frequency independent margins.

In general, the timing margins 605, 610, 615, and 620 have different purposes and relate differently to the width of the pulse 625. Accordingly, the timing margins 605 and 610 are controlled to be frequency dependent because the width of the pulse 625 influences the timing margins 605 and 610 directly.

For example, the timing margin 605 is a duration of time that provides for ensuring writing to a memory cell has completed before the memory cell is deactivated. Thus, the pulse width of the pulse 625 relates directly to the timing margin 605 since the pulse 625 activates the memory cell so that a bit value may be written/read. Additionally, the timing margin 610 is a duration of time that provides for developing a bit value on a bit line sufficiently to be sensed by a sense amplifier. The timing margin 610 is also directly related to the pulse 625 since, for example, the pulse 625 activates the memory cell to provide a bit value on the bit line when reading from the memory cell.

By contrast, the timing margin 615 is a duration of time for the sense amplifier to complete sensing before the memory cell is deactivated. While the timing margin 615 is frequency independent, this is because, for example, the timing margin 615 is accounted for by selecting the delays 630 and 635 such that sufficient time is provided. However, because the margins 605 and 610 are frequency dependent and can thus be varied to a greater degree than a frequency independent margin, the width of the pulse 625 can be varied to a sufficient degree to conserve power in comparison to maintaining the margins 605 and 610 as frequency independent.

The margin 620 is also frequency dependent and provides for ensuring bit lines in the memory device 500 are fully precharged/equalized prior to a next access. Accordingly, the memory controller 540 disables the bit line recover (BL_rec) signal according to the tailing edge 645 while enabling a subsequent bit line recover signal according to a subsequent leading edge of a next clock signal (clk). In this way, the timing margin 620 is maintained as frequency dependent and bit lines in the memory device 500 are provided with a sufficient period of time to equalize before a next access. That is, because the memory controller 540 generates the timing margin 620 as a function of different edges of the clock signal (CLK), the timing margin 620 varies along with a frequency of the clock signal (CLK).

Figure 7:
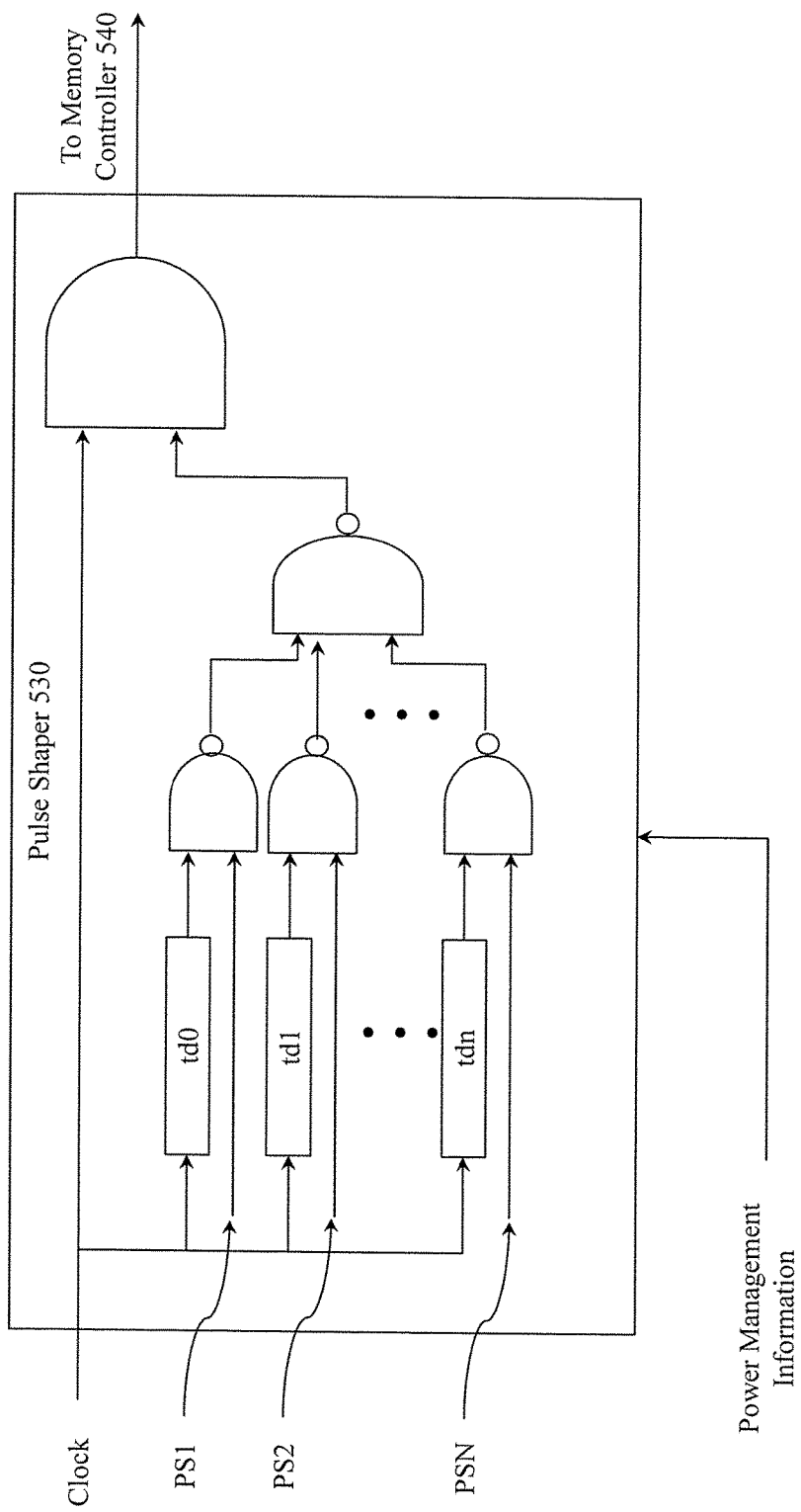
FIG. 7 illustrates one embodiment of a pulse shaper associated with providing selected delays to generate pulses with variable widths as a function of power state information.

Further explanation of the pulse shaper 530 and how the delays 630 and 635 are generated will now be discussed in relation to FIG. 7. FIG. 7 illustrates another embodiment of the pulse shaper 530. In FIG. 7, the pulse shaper 530 is illustrated with pre-configured delays td0, td1, . . . tdn. In one embodiment, the delays td0, td1, . . . tdn are determined prior to manufacturing the memory device 500 and are thus configured into the circuitry of the memory device 500 when manufactured. Thus, the delays td0, td1, . . . tdn are predetermined according to values that meet criteria for different power/frequency settings of the processor 510 that permit the memory controller 540 to reduce the pulse width 625 while providing the timing margins 605 and 610 as frequency dependent.

In one embodiment, the pulse shaper 530 receives the power state information and activates select controls PS1, PS2, . . . PSN according to the power state information so that the appropriate delays td0, td1, . . . tdn are activated via, for example, logical NAND/AND gates and provided to the memory controller 540. In this way, the pulse shaper 530, along with the memory controller 540, are configured to vary the width of the pulse 625 according to the power state information.

Figure 8:
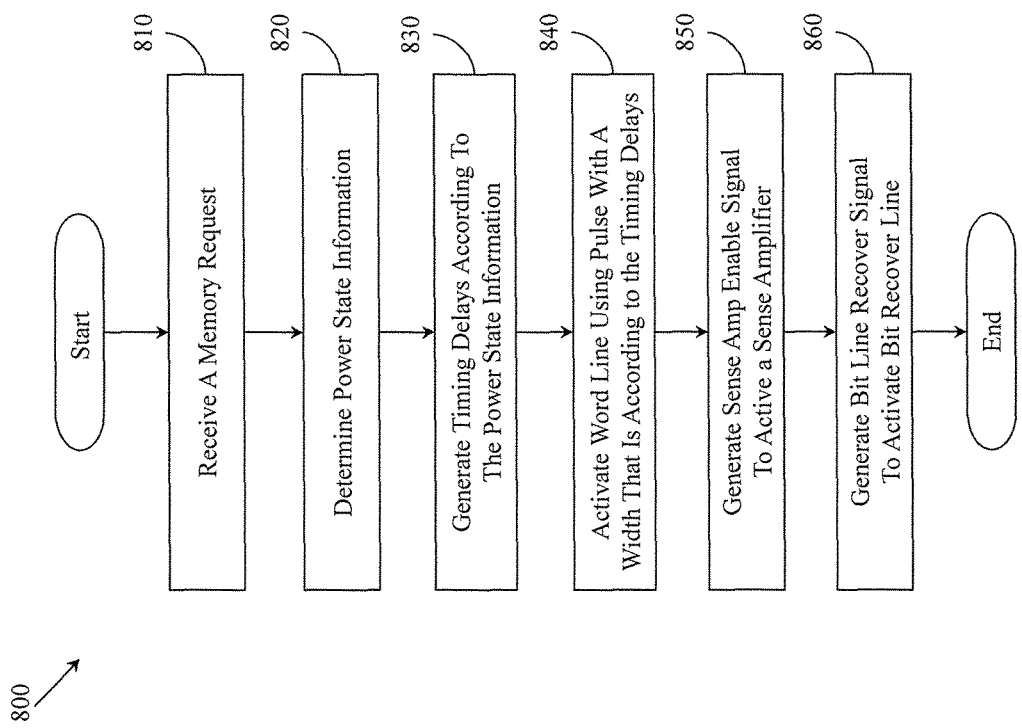
FIG. 8 illustrates one embodiment of a method associated with conserving power by varying pulse widths according to power state information.

Further aspects of varying the pulse width of a word line signal to conserve power will be discussed in relation to FIG. 8. FIG. 8 illustrates a method 800 associated with controlling a memory to conserve power. The method 800 may be performed by the memory device 500 of FIG. 5 and thus will be discussed from the perspective of the memory device 500.

At 810, the method 800 is imitated upon receiving a request to access one or more memory cells. In one embodiment, the memory controller 540 receives a request to access one or more of the memory cells 550 as specified by an address in the request. In general, the request may be a request to write data to the memory cells 550 or a request to read data from the memory cells 550. Additionally, the memory request is generally from the processor 510 or another device connected with the processor 510.

In either case, at 820, power state information is determined about a current operating state of a processor. As previously noted, the power state information may indicate a voltage and/or frequency at which the processor is currently operating. Thus, the power state information indicates whether the processor 510 is operating in a normal mode (i.e., standard voltage and frequency), a reduced power mode (i.e., reduced voltage and reduced frequency in comparison to the normal mode) or another operating mode (e.g., standby) which includes voltage and/or frequency settings different form the normal mode.

In one embodiment, the pulse shaper 530 determines the power state information by obtaining an indicator of the current operating state from a power management unit. That is, the pulse shaper 530, for example, receives one or more control signals from the power management unit that specify a frequency and/or voltage of the processor 510. In this way, the pulse shaper 530 identifies the current state so that the memory device 500 can be controlled to conserve power when the processor 510 is operating in a reduced power mode as compared to the normal mode.

At 830, timing delays for generating a pulse with a particular width according to the power state information are generated. In one embodiment, the pulse shaper 530 selects the timing delays from a set of predefined delays that correlate with different operating states of the processor. In this way, the delays for accessing the memory cells can be customized for particular operating states in order to optimize power savings in various low power modes. Additionally, the timing delays are also selected to, for example, to maintain frequency dependent margins (605 and 610).

Accordingly, the timing delays are used, at 840, to activate a word line that corresponds to an address in the request. In one embodiment, the memory controller 540 activates the word line by generating a pulse on the word line with a width that is controlled according to the clock signal (CLK) and the timing delays. In general, the memory controller 540 generates a leading edge of the pulse after a first timing delay from a leading edge of the clock signal (CLK). The memory controller 540 generates a tailing edge of the pulse from a tailing edge of the clock signal after a second timing delay. In this way, the memory controller 540 varies the width of the pulse according to the timing delays which are dependent on the power state information.

For example, if the processor 510 is in a power saving state then the width of the pulse provided to enable the word line is shorter (i.e., a shorter duration of time) than if the processor 510 is operating according to normal power settings. In one embodiment, the processor 510 reduces a frequency in the power saving state. Thus, the memory controller reduces a width of the pulse according to a degree to which the frequency has been lowered. In this way, the memory device 500 conserves power by applying a voltage of the pulse to the word line for a shorter duration. While generating the pulse is generally discussed as a single action, of course, generating the pulse on the word line include both raising a voltage and subsequently lowering a voltage provided on the word line. These two actions are performed according to the noted timing delays and the clock signal (CLK) in order to provide the pulse with an appropriate width.

Furthermore, in one embodiment, generating the pulse to enable the word line by using the selected timing delays also controls durations for frequency dependent margins between enabling/disabling the word line and between enabling the word line and enabling a sense amplifier. In this way, the pulse width can be varied without infringing on the margins and causing timing errors in the memory device 500.

At 850, a pulse (i.e., sense amp enable signal) is generated to activate a sense amplifier. In one embodiment, the memory controller 540 generates a sense amp enable signal on a sense amp enable line according to a trailing edge of the clock signal (CLK). That is, the sense amp enable signal is triggered according to the tailing edge. In this way, the sense amp enable single is triggered according to a separate edge of the clock signal (CLK) than the pulse on the word line, which causes the margin 610 to be dependent on the clock signal (CLK) and the first timing delay. In this way, the memory controller 540 can control a duration of the frequency dependent margin 610 according to the delay 630.

At 860, a pulse is generated to activate a bit recover line. In one embodiment, the memory controller 540 generates a bit recover line enable signal (i.e., pulse) according to separate successive rising edges of the clock signal (CLK) to provide a frequency dependent margin for precharging/equalizing bit lines of the memory device 500 between accesses. In one embodiment, pulse widths of the bit recover line enable signal are generated with a same pulse width as the pulse provided on the word line. Thus, the bit recover line enable signal may be generated using the timing delays from the pulse shaper 530 and the clock signal (CLK). In this way, power can be conserved when operating in a reduced power state by reducing widths of pulses provided on various control lines (e.g., WL, BL_rec). In general, a precharge/equalize circuit (not shown) is triggered by the bit line recover signal (BL_rec) to electrically connect the bit lines to one another in series with a voltage source that drives the bit lines to a precharge voltage. In one embodiment, the bit line recover signal (BL_rec) signal is generated after each read and write access.

While for purposes of simplicity of explanation, the illustrated methodologies in the figures are shown and described as a series of blocks of an algorithm, it is to be appreciated that the methodologies are not limited by the order of the blocks. Some blocks can occur in different orders and/or concurrently with other blocks from that shown and described. Moreover, less than all the illustrated blocks may be used to implement an example methodology. Blocks may be combined or separated into multiple actions/components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or the illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use.

What is claimed is:

1. A memory device embedded within a processor, the memory device comprising:
   a pulse shaper to generate a first timing delay and a second timing delay according to power state information, the power state information indicating a current operating state of the processor; and
   a memory controller to generate, in response to receiving a request to access one or more memory cells of the memory device, a word line enable signal that activates the one or more memory cells according to the first timing delay, the second timing delay, and a clock signal by generating the word line enable signal with a pulse width that is variable to conserve power when the state information indicates the processor is in a power saving state.

2. The memory device of claim 1, wherein the memory controller generates the word line enable signal by generating a leading edge of the word line enable signal beginning after the first timing delay from a leading edge of the clock signal and generating a tailing edge of the word line enable signal after the second timing delay from a tailing edge of the clock signal, wherein generating the word line enable signal activates a row of the memory cells for a duration of time equal to the pulse width.

3. The memory device of claim 1, wherein the memory controller generates the word line enable signal using the first timing delay, the second timing delay, and a clock signal to provide timing margins when accessing the one or more memory cells that are frequency dependent timing margins, and wherein the first timing delay and the second timing delay depend on an operating frequency of the processor.

4. The memory device of claim 1, wherein the memory controller generates the pulse width according to the power state information to maintain frequency dependent margins between operating components of the memory device that include timing margins between enabling the word line and enabling a sense amplifier, between enabling and disabling the word line, and between successive signals provided on a bit recover line, and
   wherein the frequency dependent margins are timing margins in the memory device that provide for accessing the one or more memory cells, for developing bit values on bit lines associated with the one or more memory cells, and for pre-charging the bit lines.

5. The memory device of claim 1, wherein the memory controller generates a sense amp enable signal on a sense amp enable line beginning at a tailing edge of the clock signal to provide a frequency dependent margin between generating the word line enable signal and generating the sense amp enable signal that accounts for timing to allow a bit value to develop on a bit line prior to a sense amplifier reading the bit value, and wherein the frequency dependent margins are timing margins that use separate edges of the clock signal to control timing in the memory device instead of using a single edge of the clock signal along with a built-in margin.

6. The memory device of claim 1, wherein the memory controller generates a bit recover enable signal on a bit recover line according to separate successive edges of the clock signal to generate the bit recover enable signal as a frequency dependent signal and an associated margin for pre-charging a bit line as a frequency dependent margin.

7. The memory device of claim 1, wherein the memory controller generates a bit recover enable signal by generating a leading edge of the bit recover enable signal beginning after the first timing delay from a leading edge of the clock signal and generating a tailing edge of the bit recover enable signal after the second timing delay from a tailing edge of the clock signal.

8. The memory device of claim 1, wherein the current operating state of the processor includes a current operating frequency of the processor and a current operating voltage of the processor that are provided to the memory controller by a power management unit in the power state information.

9. The memory device of claim 1, wherein the power state information is dynamic voltage frequency scaling (DVFS) information that is provided to the pulse shaper by a power management unit embedded with the processor, wherein the power saving state is a reduced operating state in comparison to a normal operating state of the processor where a voltage and a frequency of the processor are reduced, and wherein the memory cell is a 6 transistor static random access memory (6T SRAM).

10. A computing system, comprising:
a processor;
a power management unit; and
a memory device comprising:
a plurality of memory cells arranged in rows and columns;
a pulse shaper to generate an initial timing delay according to power state information from the power management unit indicating a current operating state of the processor; and
a memory controller to generate, in response to receiving a request to access one or more of the plurality of memory cells, a word line enable signal that activates one of the rows for a time duration equal to a pulse width of the word line enable signal that the memory controller generates according to the timing delay and a clock signal to conserve power when the power state information indicates the processor is in a power saving state.

11. The computing system of claim 10, wherein the memory controller generates the word line enable signal by generating a leading edge of the word line enable signal beginning after the initial timing delay from a leading edge of the clock signal and generating a tailing edge of the word line enable signal after a second timing delay from a tailing edge of the clock signal, and wherein the pulse shaper generates the second timing delay based, at least in part, on the power state information.

12. The computing system of claim 10, wherein the memory controller generates the word line enable signal using the initial timing delay, the second timing delay, and a clock signal to provide timing margins when accessing the row of memory cells that are frequency dependent timing margins, and wherein the initial timing delay and the second timing delay depend on an operating frequency of the processor.

13. The computing system of claim 10, wherein the memory controller generates the pulse width according to the power state information to maintain frequency dependent margins between operating components of the memory device that include timing margins that provide for accessing the one or more memory cells, for developing bit values on bit lines associated with the one or more memory cells, and for pre-charging the bit lines, and
wherein the frequency dependent margins are timing margins that use separate edges of the clock signal to enable and disable a signal instead of using a single edge of the clock signal along with a built-in margin.

14. The computing system of claim 13, wherein the current operating state of the processor includes a current operating frequency of the processor and a current operating voltage of the processor that are provided to the memory controller by a power management unit in the power state information, wherein the power saving state is a reduced operating state in comparison to a normal operating state of the processor where a voltage and a frequency of the processor are reduced, and wherein the plurality of memory cells are 6-transistor static random access memory (6T SRAM) cells.

15. A method associated with controlling access to memory cells in a memory device, the method comprising:
receiving, in the memory device, a request to access one or more of the memory cells;
determining power state information about a current operating state of a processor associated with the memory device;
selecting timing delays according to the power state information of a processor;
activating a word line associated with the one or more memory cells by generating a word line enable signal on the word line with a pulse width that is variable according to the timing delays to conserve power used by the memory device when accessing the one or more memory cells.

16. The method of claim 15, further comprising:
activating a sense amplifier by generating a sense amp enable signal on a sense amp enable line according to tailing edge of the clock signal to maintain a timing margin between the word line enable signal and the sense amp enable signal as a frequency dependent margin.

17. The method of claim 15, where determining power state information includes determining a current operating frequency of the processor and a current voltage of the processor using information from a power management unit.

18. The method of claim 15, wherein generating the word line enable signal with the pulse width according to the timing delays generates the word line enable signal with a frequency dependent margin for accessing the one or more memory cells.

19. The method of claim 15, further comprising:
activating a bit recover line by generating a bit recover line enable signal according to the timing delays to provide a frequency dependent margin for precharging bit lines associated with the one or more memory cells.

20. The method of claim 15, wherein selecting the timing delays according to the power state information includes selecting the timing delays to control a duration of one or more frequency dependent margins.

* * * * *

UNITED STATES PATENT AND TRADEMARK OFFICE
CERTIFICATE OF CORRECTION

PATENT NO. : 9,606,742 B1  
APPLICATION NO. : 14/967748  
DATED : March 28, 2017  
INVENTOR(S) : Cho et al.

Page 1 of 1

It is certified that error appears in the above-identified patent and that said Letters Patent is hereby corrected as shown below:

On the Title Page

Column 2, under Other Publications, Line 4, delete "www.jrcct.org" and insert -- www.ijrcct.org --, therefor.

Column 2, under Other Publications, Line 6, delete "http://ieexplore." and insert -- http://ieeexplore. --, therefor.

In the Claims

In Column 4, Line 21, delete "in a the" and insert -- in the --, therefor.

Signed and Sealed this  
Nineteenth Day of September, 2017

Joseph Matal  
*Performing the Functions and Duties of the*  
*Under Secretary of Commerce for Intellectual Property and*  
*Director of the United States Patent and Trademark Office*